US012771459B2

(12) United States Patent
Kato

(10) Patent No.: US 12,771,459 B2
(45) Date of Patent: Oct. 20, 2026

(54) DISTRIBUTED TRAVELING-WAVE PHOTODETECTOR

(71) Applicant: Marvell Asia Pte Ltd, Singapore (SG)

(72) Inventor: Masaki Kato, Palo Alto, CA (US)

(73) Assignee: Marvell Asia Pte Ltd, Singapore (SG)

( * ) Notice: Subject to any disclaimer, the term of this patent is extended or adjusted under 35 U.S.C. 154(b) by 65 days.

(21) Appl. No.: 19/039,802

(22) Filed: Jan. 29, 2025

(65) Prior Publication Data

US 2025/0247158 A1 Jul. 31, 2025

Related U.S. Application Data

(60) Provisional application No. 63/627,775, filed on Jan. 31, 2024.

(51) Int. Cl.

*H04B 10/80* (2013.01)
*H04B 10/69* (2013.01)
*H10W 90/00* (2026.01)

(52) U.S. Cl.

CPC ........... *H04B 10/802* (2013.01); *H04B 10/69* (2013.01); *H10W 90/00* (2026.01)

(58) Field of Classification Search

CPC ...... H04B 10/802; H04B 10/69; H04B 10/66; H10W 90/00

See application file for complete search history.

(56) References Cited

U.S. PATENT DOCUMENTS 5,523,557 A 6/1996 Bruno
6,239,422 B1 5/2001 Vang et al.
11,791,904 B2 * 10/2023 Kowalevicz ............ H04J 14/04 398/208

(Continued)

FOREIGN PATENT DOCUMENTS

EP 2677356 A1 * 12/2013 ........... G02B 6/4214
WO 2025078962 A1 4/2025

OTHER PUBLICATIONS

Chau T et al, "Generation of millimeter waves by photomixing at 1.55 Ξm using InGaAs—InAlAs—InP velocity-matched distributed photodetectors", IEEE Photonics Technology Letters, IEEE, USA, vol. 12, No. 8, Aug. 1, 2000, pp. 1055-1057.

(Continued)

*Primary Examiner* — Seung C Sohn

(74) *Attorney, Agent, or Firm* — Meitar Patents LTD.; Daniel Kligler

(57) ABSTRACT

An optical communication receiver includes an optical input configured to receive from a communication link a modulated optical wave conveying data over the communication link, and a multimode waveguide, which is coupled to receive the modulated optical wave from the optical input and has a width that is selected to cause the modulated optical wave to form multiple interference maxima over an area of the multimode waveguide. The optical communication receiver further includes multiple optical detectors disposed over the multimode waveguide in alignment with respective ones of the interference maxima and configured to output electrical signals in response to optical energy absorbed by the optical detectors from the multimode waveguide, and signal processing circuitry coupled to process and demodulate the electrical signals so as to extract and output the data.

18 Claims, 4 Drawing Sheets

(56) References Cited

U.S. PATENT DOCUMENTS

| | | | |
|---|---|---|---|
| 2004/0056179 A1 | 3/2004 | Wang et al. |
| 2005/0263787 A1 | 12/2005 | Ishimura et al. |
| 2016/0056900 A1 | 2/2016 | Okamoto et al. |
| 2018/0138325 A1 | 5/2018 | Watanuki et al. |

OTHER PUBLICATIONS

Nespola A et al, "Analysis of failure mechanisms in velocity-matched distributed photodetectors", IEE Proceedings: Optoelectronics, Institution of Electrical Engineers, Stevenage, GB, vol. 146, No. 1, Feb. 16, 1999, pp. 25-30.

Kato, "Ultrawide-Band/High-Frequency Photodetectors", IEEE Transactions on Microwave Theory and Techniques, IEEE, USA, vol. 47, No. 7, Jul. 1, 1999, pp. 1265-1276.

European Search Report, Application No. 25154989.5, dated Jul. 1, 2025.

International Application # PCT/IB2024/059862 Search Report dated Feb. 5, 2025.

Gupta et al., "A Review on Silicon-Based Photodetectors," International Journal of Innovative Research in Science, Engineering and Technology, vol. 5, issue 2, pp. 1245-1252, Feb. 2016.

Ito et al., "Waveguide-Integrated Vertical pin Photodiodes of Ge Fabricated on p+ and n+ Si-on-Insulator Layers," Extended Abstracts of the 2016 International Conference on Solid State Devices and Materials, Tsukuba, Japan, pp. 151-152, year 2016.

Hu et al., in "High-speed and High-power Germanium Photodetector with a Lateral Silicon Nitride Waveguide," Photonics Research, vol. 9, No. 5, pp. 749-756, May 2021.

Pishvaibazargani et al., U.S. Appl. No. 18/909,993, filed Oct. 9, 2024.

* cited by examiner

DISTRIBUTED TRAVELING-WAVE PHOTODETECTOR

CROSS-REFERENCE TO RELATED APPLICATION

This application claims the benefit of U.S. Provisional Patent Application 63/627, 775, filed Jan. 31, 2024, which is incorporated herein by reference.

FIELD OF THE INVENTION

The present disclosure relates generally to optical communication, and particularly to photodetector design.

BACKGROUND

Photodetectors are fundamental building blocks in optical communication devices and other opto-electronic systems. Some photodetectors integrated in silicon-on-insulator (SOI) guided-wave optical circuits use germanium as the light-absorbing layer. Silicon-Germanium (Si—Ge) photodetectors are described, for example, by Ito and Ishikawa, in "Waveguide-Integrated Vertical PIN Photodiodes of Ge Fabricated on p+ and n+ Si-on-Insulator Layers," Extended Abstracts of the 2016 International Conference on Solid State Devices and Materials, Tsukuba, Japan, 2016; and by Hu et al., in "High-speed and high-power germanium photodetector with a lateral silicon nitride waveguide," Photonics Research, Volume 9, No. 5, May 2021.

SUMMARY

Embodiments of the present invention that are described hereinbelow provide improved designs for integrated photodetectors.

There is therefore provided, in accordance with an embodiment of the invention, an optical communication receiver, including an optical input configured to receive from a communication link a modulated optical wave conveying data over the communication link, and a multimode waveguide, which is coupled to receive the modulated optical wave from the optical input and has a width that is selected to cause the modulated optical wave to form multiple interference maxima over an area of the multimode waveguide. The optical communication receiver further includes multiple optical detectors disposed over the multimode waveguide in alignment with respective ones of the interference maxima and configured to output electrical signals in response to optical energy absorbed by the optical detectors from the multimode waveguide, and signal processing circuitry coupled to process and demodulate the electrical signals so as to extract and output the data.

In a disclosed embodiment, the optical input includes an optical waveguide having a first width, wherein the width of the multimode waveguide is a second width, which is greater than the first width.

In some embodiments, the interference maxima and the optical detectors are disposed along a length of the multimode waveguide, and the receiver includes an electrical transmission line coupled to the optical detectors and configured to convey an electrical traveling wave in response to the electrical signals output by the optical detectors. In one embodiment, the electrical transmission line has an impedance chosen to match a velocity of the electrical traveling wave to the modulated optical wave propagating in the multimode waveguide. Additionally or alternatively, the electrical transmission line includes a signal electrode connected to the optical detectors in series along the length of the multimode waveguide and at least one ground electrode extending parallel to the signal electrode along the length of the multimode waveguide.

In yet another embodiment, the receiver includes a semiconductor substrate, wherein the multimode waveguide is deposited on the semiconductor substrate, the optical detectors are deposited over the multimode waveguide, and the signal electrode is deposited over the optical detectors.

In a disclosed embodiment, the multimode waveguide includes silicon (Si). Additionally or alternatively, the multiple optical detectors include germanium (Ge).

In a disclosed embodiment, the electrodes include a silicide.

There is also provided, in accordance with an embodiment of the invention, a method for communication, the method including receiving from a communication link a modulated optical conveying wave data over the communication link, coupling the modulated optical wave into a multimode waveguide having a width that is selected to cause the optical wave to form multiple interference maxima over an area of the multimode waveguide, and sensing the modulated optical wave using multiple optical detectors disposed over the multimode waveguide in alignment with respective ones of the interference maxima and configured to output electrical signals in response to optical energy absorbed by the optical detectors from the multimode waveguide.

The present invention will be more fully understood from the following detailed description of the embodiments thereof, taken together with the drawings in which:

DETAILED DESCRIPTION OF EMBODIMENTS

Figure 1:
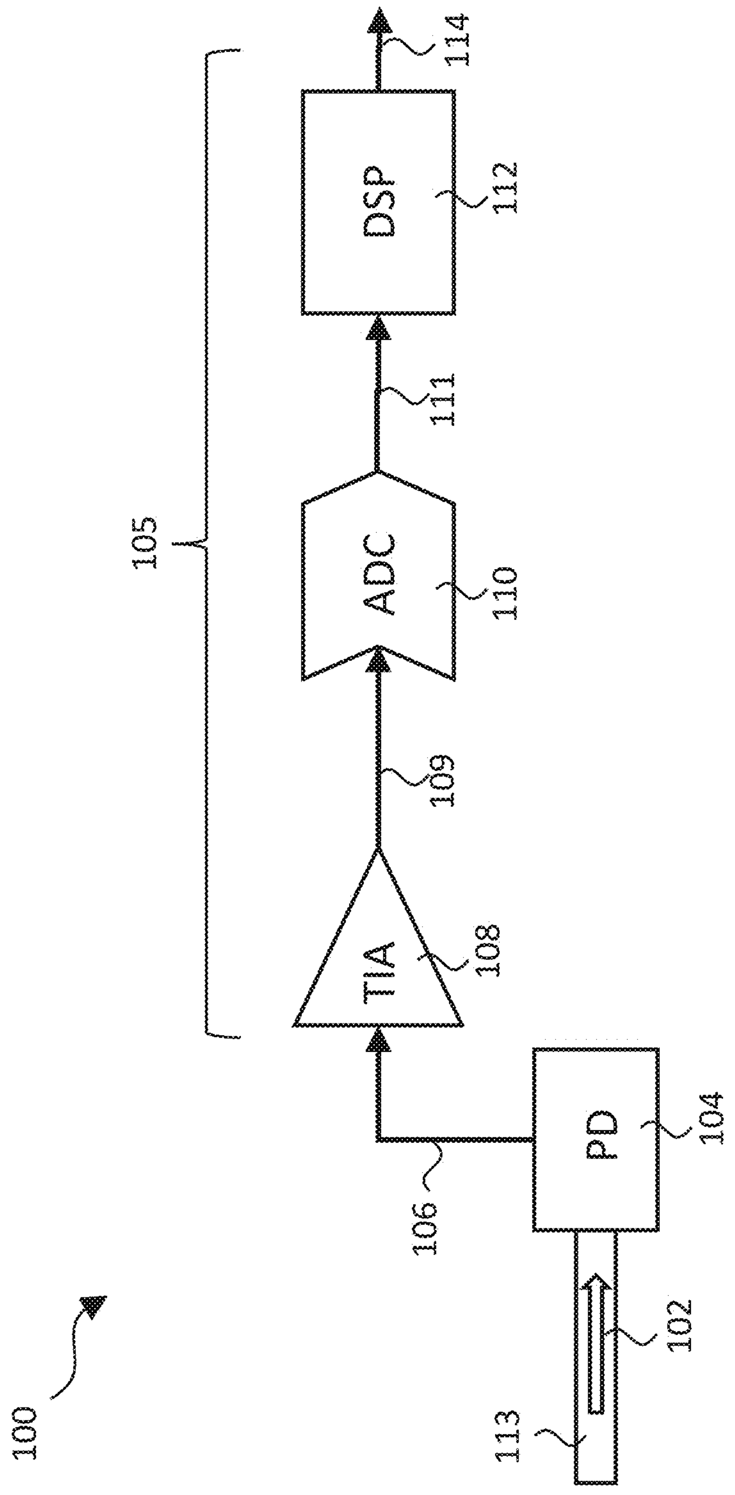
FIG. 1 is a block diagram that schematically illustrates an optical communication receiver, in accordance with an embodiment of the invention.

Photodiodes are used in optical communication receivers to convert a modulated optical wave propagating in a silicon-on-insulator waveguide into an electrical signal. The bandwidth of a photodiode is limited by the resistor-capacitor (RC) bandwidth fRC of the photodiode and the carrier transport bandwidth ftr, combining to an overall bandwidth f given by 1/f2=1/fRC2+1/ftr2. The RC bandwidth fRC is determined by the RC time constant of the series resistance of the photodiode and its junction capacitance. The transport bandwidth ftr is limited by the thickness of the PIN-junction of the photodiode, i.e., the intrinsic thickness of the absorber, which determines the carrier transport time across the junction. Decreasing the junction thickness to increase ftr has the drawback of increasing the junction capacitance and lowering fRC, thus lowering the overall bandwidth f. Reducing the detector area to reduce the junction capacitance also reduces the responsivity of the detector, i.e., the efficiency of the conversion of the optical wave to photocurrent.

The embodiments of the present invention that are described herein address these problems by providing a distributed traveling-wave photodetector architecture, providing a high bandwidth with minimal impact on the responsivity of the detector. The modulated optical wave propagating in a waveguide, such as the input waveguide of an optical receiver, is coupled into a wider multimode waveguide that functions as a multimode interferometer (MMI). The optical wave propagating within the multimode waveguide reflects from its sidewalls with the reflections interfering with each other and forming multiple interference maxima of high optical intensity within the multimode waveguide. These maxima have small lateral dimensions (in the plane of the semiconductor substrate on which the MMI is formed), for example on the order of 1-2 μm.

Optical detectors, such as Ge detectors having lateral dimensions comparable to those of the interference maxima, are disposed over the locations of the respective maxima. The detectors output electrical signals in response to optical energy that they absorb from the multimode waveguide, typically by evanescent coupling. Signal processing circuitry processes and demodulates the electrical signals so as to extract and output the data conveyed by the modulated optical wave.

In some embodiments, to couple the electrical signals out of the optical detectors, a signal electrode is deposited over the Ge detectors, coupling the detectors in series. One or more ground electrodes, parallel to the signal electrode, are deposited over the substrate and connected to it through metal-filled vias. The signal and ground electrodes form an electrical transmission line with its impedance chosen so that the velocity of the electrical traveling wave matches that of the modulated optical wave propagating in the multimode waveguide. This transmission line couples the detector output to the signal processing circuitry.

The small area of the Ge detectors in the present embodiments makes it possible to reduce the thickness of the detectors, to increase ftr, without an undue decrease in fRC. As each Ge detector is aligned with an interference maximum of the optical wave, absorbing typically 30% of the optical energy within the maximum, an overall high responsivity of the receiver is assured. Because of the small size of the interference maxima, the vias of the electrodes can be spaced sufficiently far from the interference maxima to minimize their effect on the absorption of the optical energy by the detectors from the interference maxima.

FIG. 1 is a block diagram that schematically illustrates an optical communication receiver 100, in accordance with an embodiment of the invention.

Communication receiver 100 comprises an optical device 104, functioning as a photodetector (PD), and signal processing circuitry 105 comprising a trans-impedance amplifier (TIA) 108, an analog-to-digital converter (ADC) 110, and a digital signal processor (DSP) 112, coupled in series. Communication receiver 100 receives from a communication link 113 a modulated optical wave 102 conveying data over the communication link. Modulated optical wave 102 enters device 104, which absorbs optical energy from the modulated optical wave and converts it to electrical output signals, such as a photocurrent signal 106. Signal processing circuitry 105 processes and demodulates signal 106 so as to extract and output the data into an output data signal 114. Specifically, TIA 108 converts the photocurrent to an analog voltage signal 109. Analog signal 109 is coupled to ADC 110, which converts it to a digital signal 111. Digital signal 111 is coupled to a DSP 112, which demodulates the signal to extract the data and outputs the data as output data signal 114 of communication receiver 100.

Figure 2A:
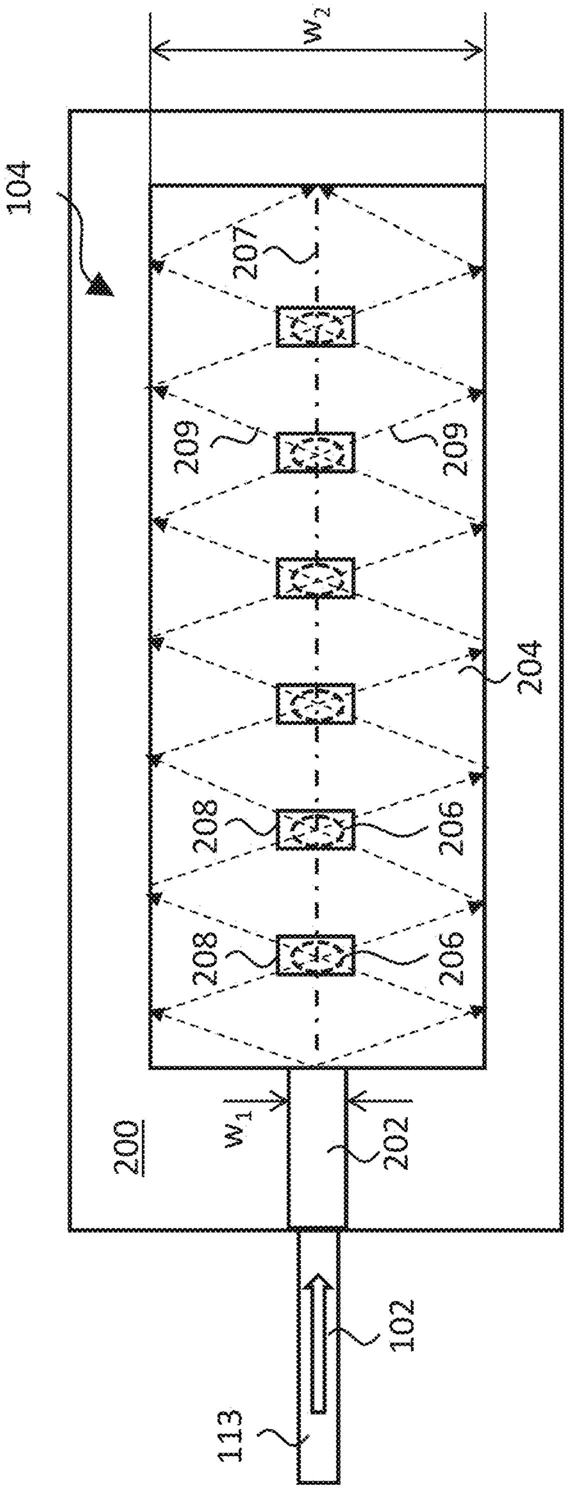
FIGS. 2A and 2B are schematic top views of a photodetector in the communication receiver of FIG. 1, according to an embodiment of the invention.
Figure 2B:
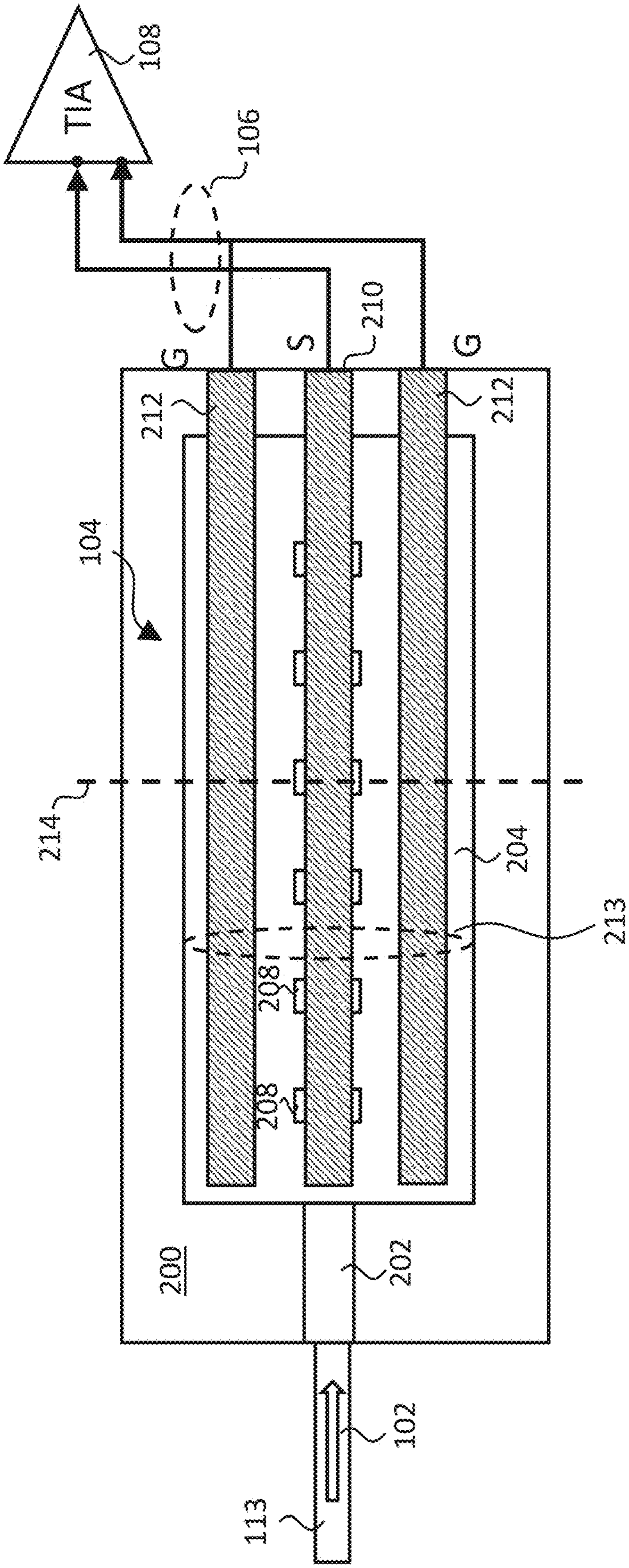

FIGS. 2A and 2B are schematic top views of device 104 (FIG. 1), according to an embodiment of the invention. For the sake of clarity, device 104 is shown in FIG. 2A without overlying electrodes, which are subsequently added in FIG. 2B.

FIG. 2A shows device 104, deposited on a semiconductor substrate 200, such as an SOI substrate, and comprising an input waveguide 202 of a width w1, and a multimode waveguide 204 of a width w2, wherein w2>w1. Modulated optical wave 102 enters input waveguide 202 and is coupled to multimode waveguide 204. Width w2 of multimode waveguide 204 is selected so as to cause the optical wave to form multiple interference maxima 206 over the area of the multimode waveguide. For a symmetrical multimode waveguide 204, interference maxima 206 are formed along the length of the multimode waveguide, i.e., on its axis 207 of symmetry. The creation of interference maxima 206 along axis 207 is illustrated schematically by arrows 209, representing local maxima in the multimode interference pattern. However, arrows 209 do not accurately reflect the entire mode pattern of the optical wave within multimode waveguide 204; they are added only for the purpose of visualization.

Device 104 further comprises multiple optical detectors 208 deposited over multimode waveguide 204 in alignment with respective interference maxima 206. Detectors 208 output electrical signals in response to optical energy absorbed by the optical detectors from the multimode waveguide. Optical detectors 208 comprise a semiconductor material, such as Ge, absorbing optical energy from interference maxima 206 through evanescent coupling between multimode waveguide 204 and the detectors. The lateral dimensions of detectors 208 are comparable to those of interference maxima 206, typically 1-2 μm. As a high portion of the energy in the guided optical wave within multimode waveguide 204 is concentrated in interference maxima 206, even small detectors 208 will absorb a large portion (typically 30% at each maximum 206) of the optical energy and convert it into electrical signals.

FIG. 2B shows device 104 further comprising a signal electrode 210 and two ground electrodes 212 deposited over the device, wherein the electrodes comprise a conducting material, such as a suitable silicide. Signal electrode 210 is connected to optical detectors 208 in series along the length of multimode waveguide 204, and ground electrodes 212 extend parallel to the signal electrode along the length of the multimode waveguide. Signal electrode 210 and ground electrodes 212 together form an electrical transmission line 213, which has an impedance Z chosen to match the velocity velectrical of the electrical traveling wave in the transmission line to the velocity voptical of the modulated optical wave propagating in multimode waveguide 204. Output electrical signal 106 (FIG. 1) is coupled to TIA 108 and further to other components of receiver 100, as shown in FIG. 1 hereinabove.

Figure 3:
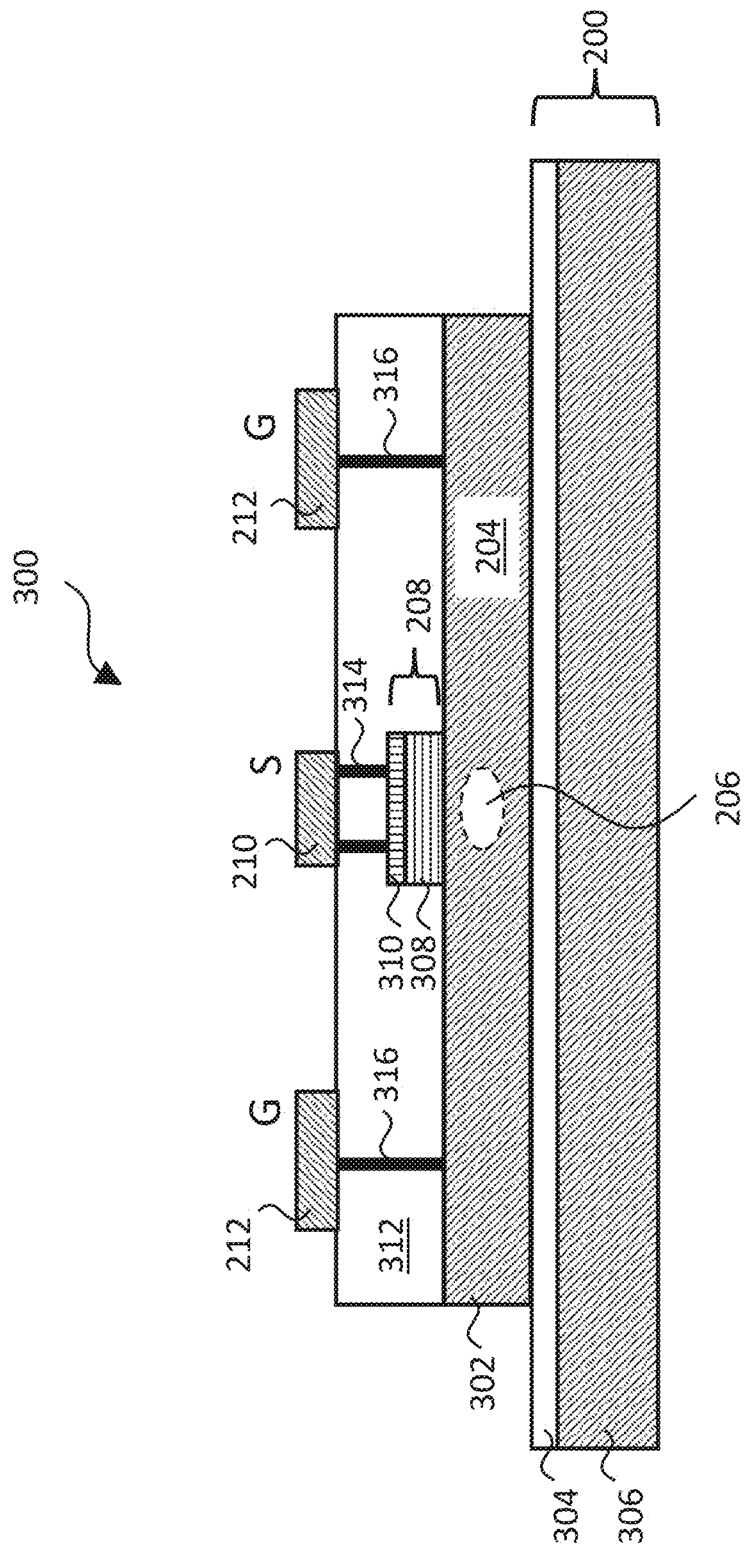
FIG. 3 is a schematic sectional view of the photodetector of FIGS. 2A and 2B, in accordance with an embodiment of the invention.

FIG. 3 is a sectional view 300 of device 104 along a line 214 in FIG. 2B, in accordance with an embodiment of the invention.

Multimode waveguide 204 (FIGS. 2A-2B) comprises a layer 302 of either n- or p-doped Si. Multimode waveguide 204 and optical waveguide 202 are deposited and etched on semiconductor substrate 200, for example an SOI substrate comprising a layer of silicon dioxide (SiO2) 304 and a Si layer 306. The optical guided wave propagating in layer 302 forms interference maxima 206 in multimode waveguide 204, as previously described, with one of the maxima shown in the sectional view of the current figure. Optical detectors 208 are deposited and etched over layer 302 in alignment with interference maxima 206. Each detector 208 comprises a layer 308 of intrinsic Ge and a layer 310 of either p- or n-doped Ge deposited and etched on multimode waveguide 204, wherein the doping is selected to be opposite to that of layer 302. An insulating layer 312, comprising $SiO_2$ for example, is deposited over layer 302, encapsulating detectors 208.

Waveguides 202 and 204, SiO2 layer 304, Si layer 306, and Ge layers 308 and 310 are deposited, etched and doped as required using semiconductor fabrication processes that are known in the art.

Signal electrode 210 and ground electrodes 212 are deposited over insulating layer 312. Signal electrode 210 is connected to detector 208 with one or more vias 314 filled with a conductive material, such as a metal. Ground electrodes 212 are similarly coupled to Si layer 302 with metal-filled vias 316. Vias 314 are sufficiently far from interference maxima 206 so as not to interfere with the absorption of the optical energy from the interference maximum by the detector.

It is noted that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical communication receiver, comprising:

an optical input configured to receive from a communication link a modulated optical wave conveying data over the communication link;

a multimode waveguide, which is coupled to receive the modulated optical wave from the optical input and has a width that is selected to cause the modulated optical wave to form multiple interference maxima over an area of the multimode waveguide;

multiple optical detectors disposed over the multimode waveguide in alignment with respective ones of the interference maxima and configured to output electrical signals in response to optical energy absorbed by the optical detectors from the multimode waveguide; and signal processing circuitry coupled to process and demodulate the electrical signals so as to extract and output the data.

2. The receiver according to claim 1, wherein the optical input comprises an optical waveguide having a first width and wherein the width of the multimode waveguide is a second width, which is greater than the first width.

3. The receiver according to claim 1, wherein the interference maxima and the optical detectors are disposed along a length of the multimode waveguide, and wherein the receiver comprises an electrical transmission line coupled to the optical detectors and configured to convey an electrical traveling wave in response to the electrical signals output by the optical detectors.

4. The receiver according to claim 3, wherein the electrical transmission line has an impedance chosen to match a velocity of the electrical traveling wave to the modulated optical wave propagating in the multimode waveguide.

5. The receiver according to claim 3, wherein the electrical transmission line comprises:

a signal electrode connected to the optical detectors in series along the length of the multimode waveguide; and at least one ground electrode extending parallel to the signal electrode along the length of the multimode waveguide.

6. The receiver according to claim 5 and comprising a semiconductor substrate, wherein the multimode waveguide is deposited on the semiconductor substrate, the optical detectors are deposited over the multimode waveguide, and the signal electrode is deposited over the optical detectors.

7. The receiver according to claim 6, wherein the multimode waveguide comprises silicon (Si).

8. The receiver according to claim 7, wherein the multiple optical detectors comprise germanium (Ge).

9. The receiver according to claim 5, wherein the electrodes comprise a silicide.

10. A method for communication, comprising:

receiving from a communication link a modulated optical wave conveying data over the communication link;

coupling the modulated optical wave into a multimode waveguide having a width that is selected to cause the optical wave to form multiple interference maxima over an area of the multimode waveguide; and sensing the modulated optical wave using multiple optical detectors disposed over the multimode waveguide in alignment with respective ones of the interference maxima and configured to output electrical signals in response to optical energy absorbed by the optical detectors from the multimode waveguide.

11. The method according to claim 10 wherein receiving the modulated optical wave comprises inputting the modulated optical wave to the multimode waveguide through an input waveguide having a first width, and wherein the width of multimode waveguide is a second width, which is greater than the first width.

12. The method according to claim 10, wherein the interference maxima and the optical detectors are disposed along a length of the multimode waveguide, and wherein sensing the modulated optical wave comprises coupling an electrical transmission line to the optical detectors, wherein the electrical transmission line is configured to convey an electrical traveling wave in response to the electrical signals output by the optical detectors.

13. The method according to claim 12, wherein coupling the electrical transmission line comprises setting an impedance of the electrical transmission line to match a velocity of the electrical traveling wave to the modulated optical wave propagating in the multimode waveguide.

14. The method according to claim 12, wherein coupling the electrical transmission line comprises:

connecting a signal electrode to the optical detectors in series along the length of the multimode waveguide; and extending at least one ground electrode parallel to the signal electrode along the length of the multimode waveguide.

15. The method according to claim 14 and comprising:

providing a semiconductor substrate;

depositing the multimode waveguide on the semiconductor substrate;

depositing the optical detectors over the multimode waveguide; and depositing the signal electrode over the optical detectors.

16. The method according to claim 15, wherein depositing the multimode waveguide comprises depositing and etching a silicon (Si) layer on the semiconductor substrate.

17. The method according to claim 16, wherein depositing the multiple optical detectors comprises depositing and etching a germanium (Ge) layer over the Si layer.

18. The method according to claim 14, wherein connecting the signal electrode comprises depositing a silicide electrode over the optical detectors.

* * * * *